(12) United States Patent
Liu et al.

(10) Patent No.: US 12,262,645 B2
(45) Date of Patent: Mar. 25, 2025

(54) MAGNETORESISTIVE RANDOM ACCESS MEMORY WITH METAL OXIDE LAYER ON TOP SURFACE AND SIDEWALL OF MTJ

(71) Applicant: UNITED MICROELECTRONICS CORP., Hsin-Chu (TW)

(72) Inventors: An-Chi Liu, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/224,066

(22) Filed: Jul. 20, 2023

(65) Prior Publication Data

US 2023/0363286 A1 Nov. 9, 2023

Related U.S. Application Data

(63) Continuation of application No. 17/209,251, filed on Mar. 23, 2021, now Pat. No. 11,758,824, which is a continuation of application No. 16/455,674, filed on Jun. 27, 2019, now Pat. No. 10,991,875.

(30) Foreign Application Priority Data

May 31, 2019 (CN) .......................... 201910467483.9

(51) Int. Cl.
| | |
|---|---|
| H10N 50/80 | (2023.01) |
| G11C 11/16 | (2006.01) |
| H10B 61/00 | (2023.01) |
| H10N 50/01 | (2023.01) |
| H10N 50/85 | (2023.01) |

(52) U.S. Cl.
CPC ........... *H10N 50/80* (2023.02); *G11C 11/161* (2013.01); *H10B 61/00* (2023.02); *H10N 50/01* (2023.02); *H10N 50/85* (2023.02)

(58) Field of Classification Search
CPC ......... H01L 43/02; H01L 43/10; H01L 43/12; H01L 27/222; H10N 50/80; H10N 50/01; H10N 50/85; H10B 61/00
See application file for complete search history.

(56) References Cited

U.S. PATENT DOCUMENTS

| 9,343,659 | B1 | 5/2016 | Lu et al. | |
|---|---|---|---|---|
| 10,991,875 | B2 | 4/2021 | Liu | |
| 2016/0020383 | A1 | 1/2016 | Kang et al. | |
| 2016/0268336 | A1 | 9/2016 | Shum | |
| 2017/0222128 | A1* | 8/2017 | Sung | H10N 50/80 |
| 2018/0366487 | A1 | 12/2018 | Okizumi | |
| 2018/0374895 | A1* | 12/2018 | Hsu | H10N 50/01 |
| 2019/0013353 | A1 | 1/2019 | Lee | |

(Continued)

FOREIGN PATENT DOCUMENTS

CN 101853830 A 10/2010

*Primary Examiner* — Lex H Malsawma
(74) *Attorney, Agent, or Firm* — Winston Hsu

(57) ABSTRACT

A semiconductor device includes a substrate having a magnetic tunneling junction (MTJ) region and a logic region, an inter-metal dielectric (IMD) layer on the substrate, a MTJ in the IMD layer on the MTJ region, a first metal interconnection in the IMD layer on the logic region, and protrusions adjacent to two sides of the first metal interconnection. Preferably, the MTJ further includes a bottom electrode, a fixed layer, a barrier layer, a free layer, and a top electrode.

12 Claims, 7 Drawing Sheets

(56) References Cited

U.S. PATENT DOCUMENTS

| | | |
|---|---|---|
| 2019/0051641 A1 | 2/2019 | Lee |
| 2019/0165041 A1 | 5/2019 | Chuang |
| 2019/0386204 A1 | 12/2019 | Chen |
| 2020/0028067 A1 | 1/2020 | Jiang |
| 2020/0303623 A1* | 9/2020 | Wiegand ................ H10B 61/22 |
| 2020/0321394 A1* | 10/2020 | Hashemi ................ H10B 61/10 |

* cited by examiner

MAGNETORESISTIVE RANDOM ACCESS MEMORY WITH METAL OXIDE LAYER ON TOP SURFACE AND SIDEWALL OF MTJ

CROSS REFERENCE TO RELATED APPLICATIONS

This application is a continuation application of U.S. application Ser. No. 17/209,251, filed on Mar. 23, 2021, which is a continuation application of U.S. application Ser. No. 16/455,674, filed on Jun. 27, 2019. The contents of these applications are incorporated herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate having a magnetic tunneling junction (MTJ) region and a logic region, an inter-metal dielectric (IMD) layer on the substrate, a MTJ in the IMD layer on the MTJ region, a first metal interconnection in the IMD layer on the logic region, and protrusions adjacent to two sides of the first metal interconnection. Preferably, the MTJ further includes a bottom electrode, a fixed layer, a barrier layer, a free layer, and a top electrode.

According to another aspect of the present invention, a semiconductor device includes a substrate having a magnetic tunneling junction (MTJ) region and a logic region, a MTJ on the MTJ region, a first inter-metal dielectric (IMD) layer on the substrate and around the MTJ, a second IMD layer on the MTJ and the first IMD layer, a first metal interconnection in the second IMD layer and on the MTJ, and a second metal interconnection in the second IMD layer on the logic region. Preferably, bottom surfaces of the first metal interconnection and the second metal interconnection include different curves and the MTJ further includes a bottom electrode, a fixed layer, a barrier layer, a free layer, and a top electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
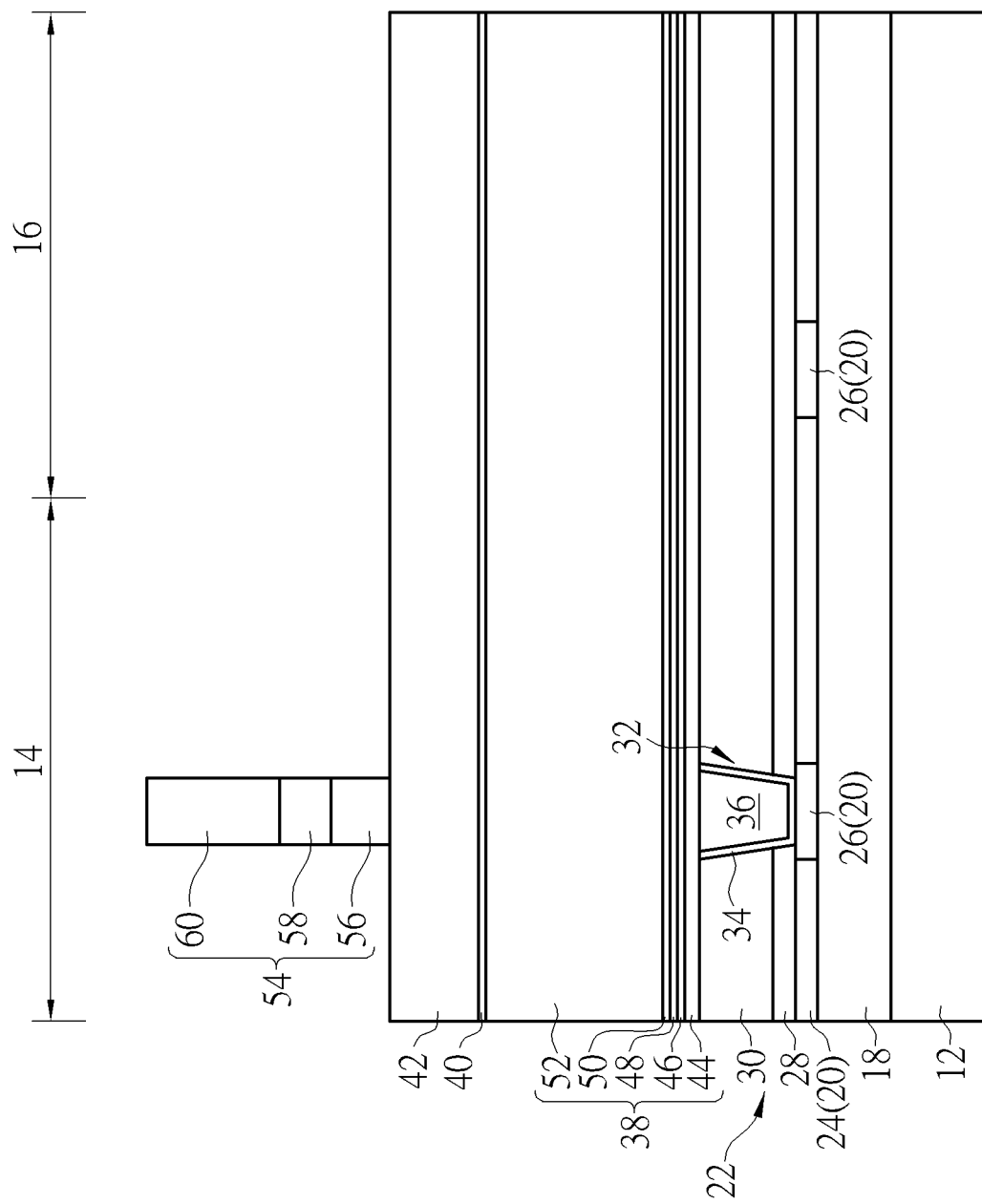
FIGS. 1-6 illustrate a method for fabricating a semiconductor device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and a metal interconnection 32 embedded in the stop layer 28 and the IMD layer 30.

In this embodiment, each of the metal interconnections 26 from the metal interconnect structure 20 preferably includes a trench conductor and the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24,

30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide (AlOx) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
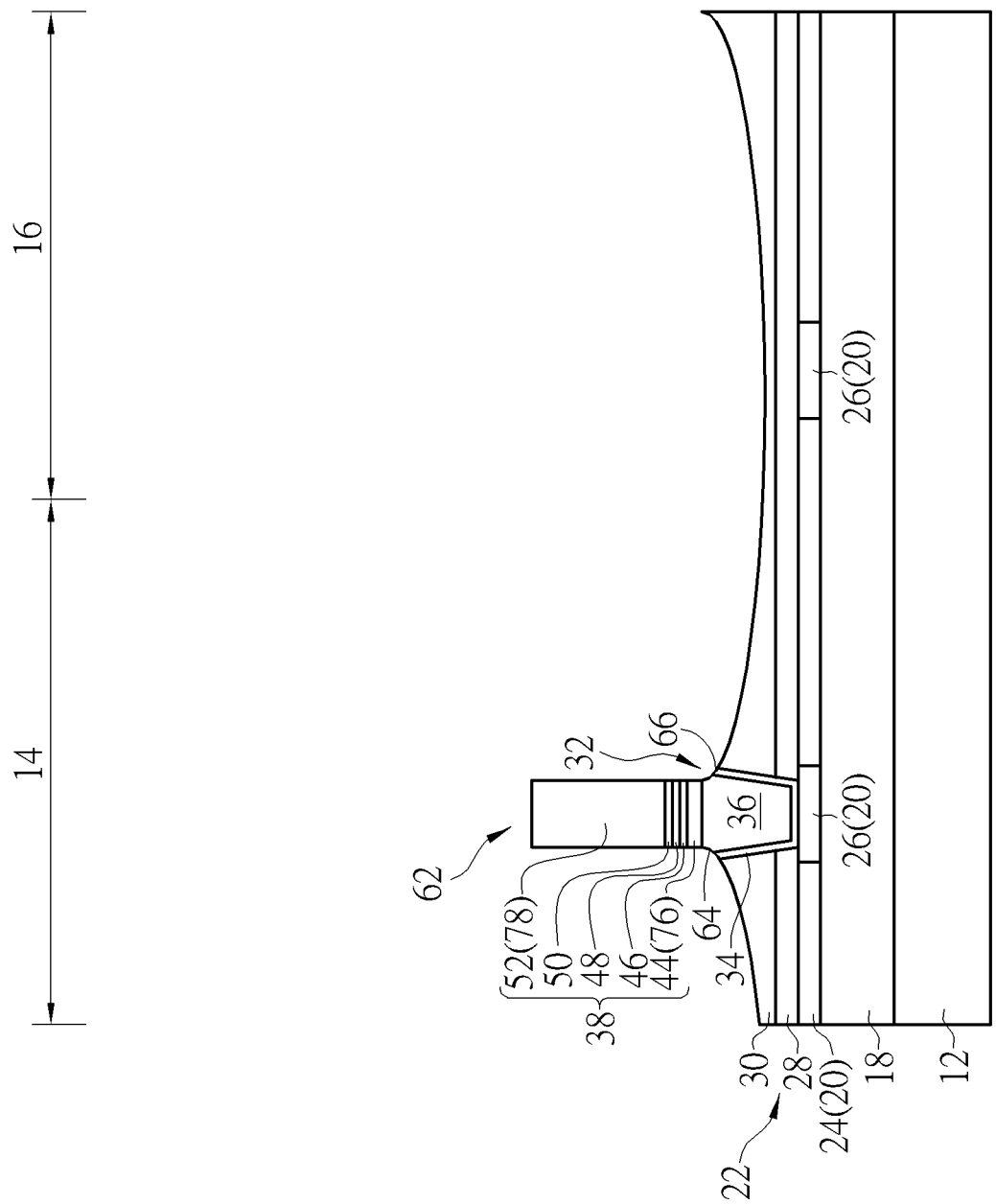

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnection 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 64 and a second slanted sidewall 66 are formed on the metal interconnection 32 adjacent to the MTJ 62, in which each of the first slanted sidewall 64 and the second slanted sidewall 66 could further include a curve (or curved surface) or a planar surface.

Figure 3:
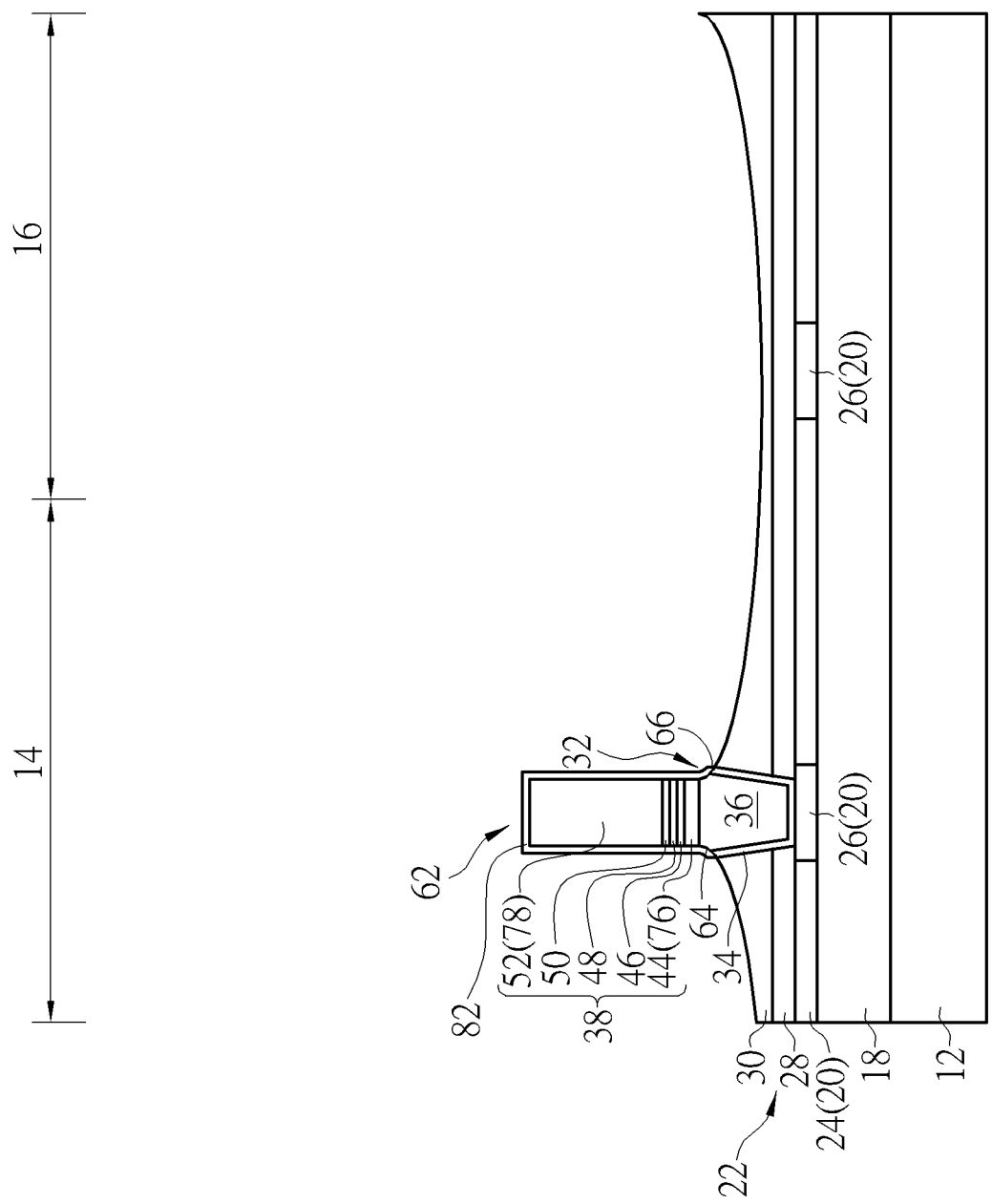

Next, as shown in FIG. 3, an oxidation process is conducted to form a metal oxide layer 82 on the surface of the MTJ 62 and metal interconnection 32, including sidewalls of the MTJ 62, top surface of the MTJ 62, and top surface of the metal interconnection 32. It should be noted that the metal oxide layer 82 formed at this stage preferably includes different materials according to the material of each layer within the MTJ 62. For instance, if the top electrode 78 were made of tantalum (Ta) or titanium (Ti), the metal oxide layer 82 around and directly contacting the top electrode 78 would preferably include tantalum oxide (TaO) or titanium oxide (TiO). Similarly, the metal oxide layer 82 formed on sidewalls of the fixed layer 46, the barrier layer 48, and the free layer 50 would also include corresponding oxidized metals after the original material of each layer is oxidized in the oxidation process. Since each of the top electrode 78, the free layer 50, the barrier layer 48, the fixed layer 46, and the bottom electrode 76 are made of different metal materials and/or magnetic materials, the metal oxide layer 82 formed on sidewalls of each of the layers 78, 50, 48, 46, 76 would also include different materials.

Figure 4:
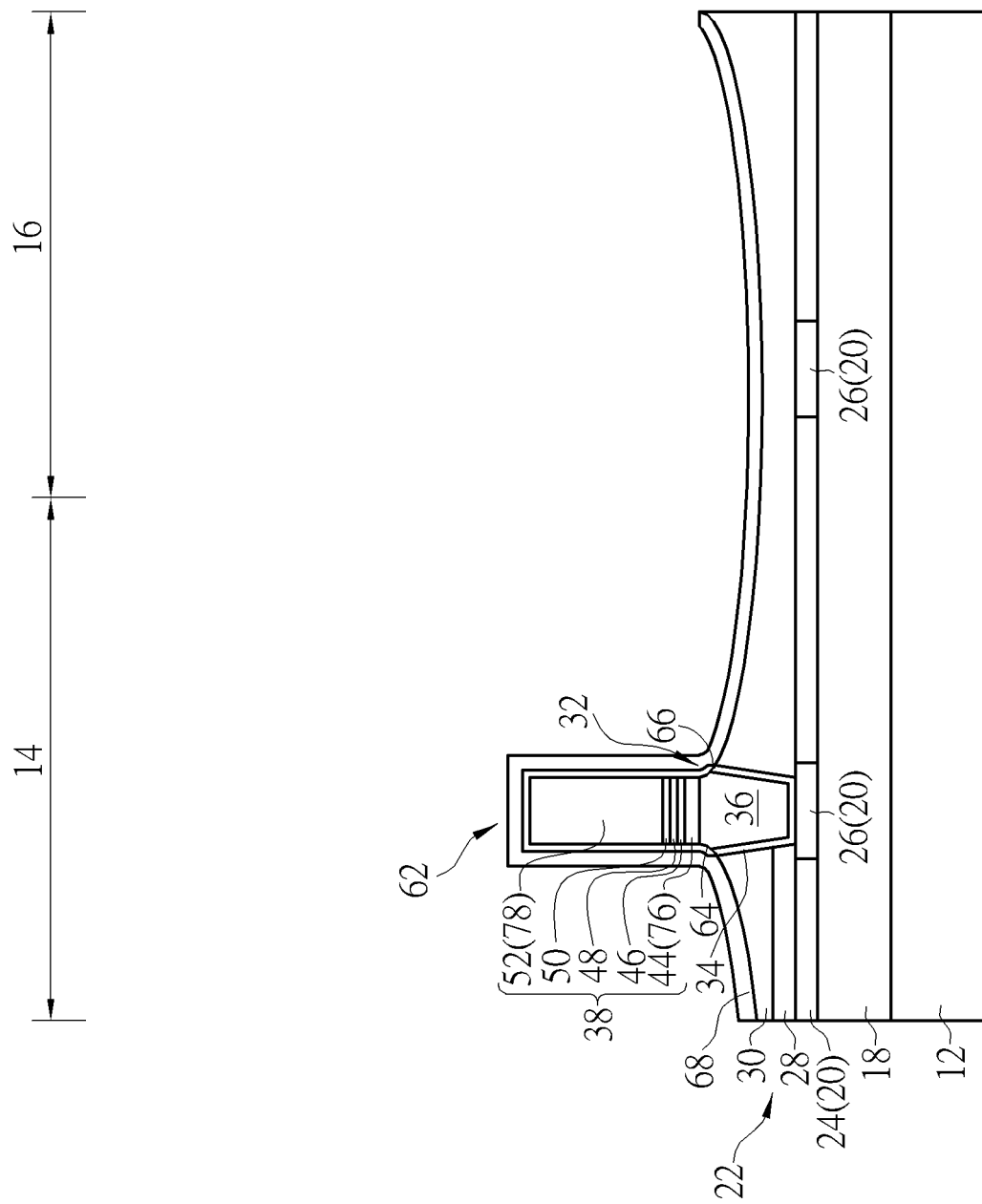

Next, as shown in FIG. 4, a liner 68 is formed on the MTJ 62 to cover the surface of the metal oxide layer 82. In this embodiment, the liner 68 preferably includes silicon nitride, but could also include other dielectric material including but not limited to for example silicon oxide, silicon oxynitride, or silicon carbon nitride.

Figure 5:
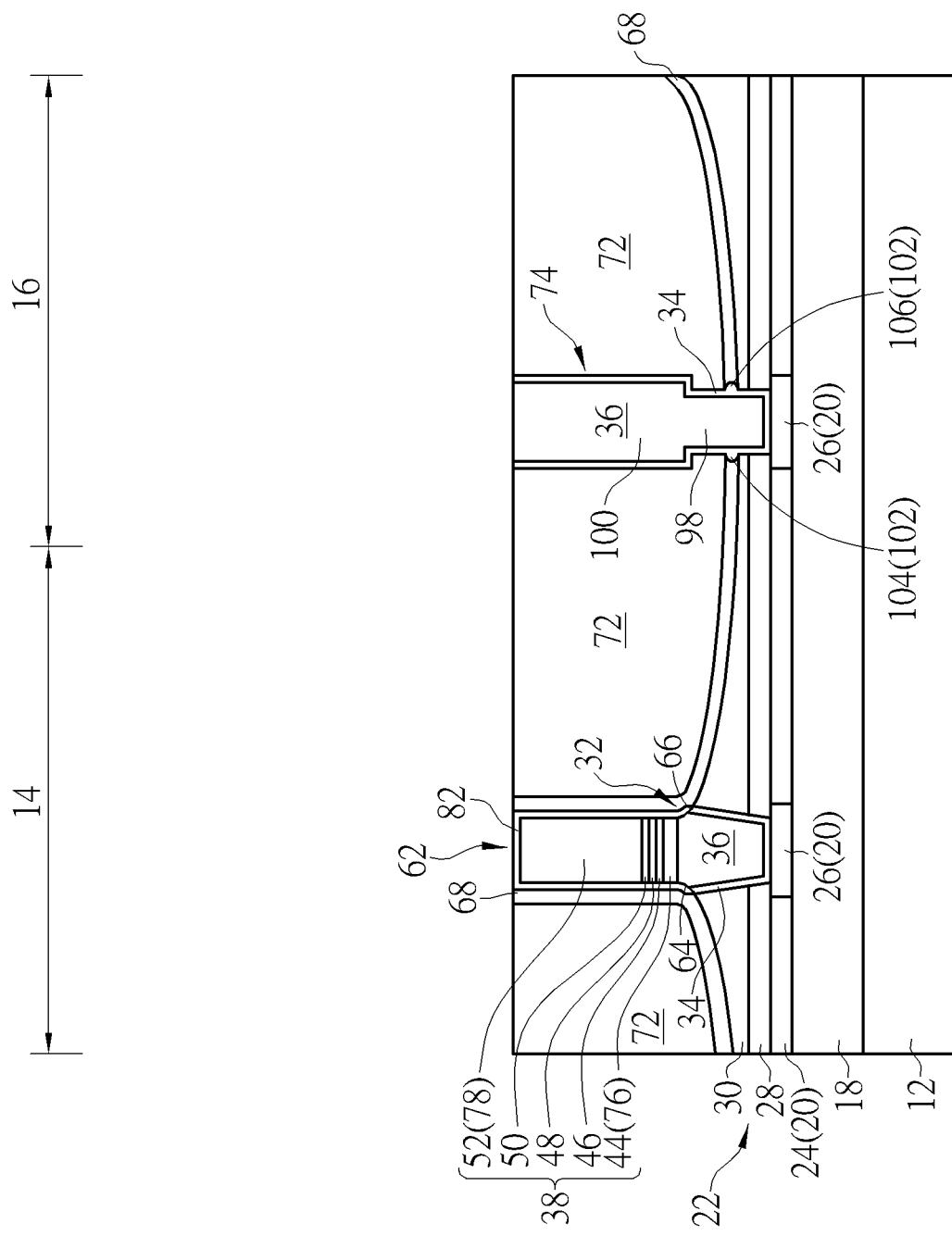

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with the top surface of the MTJ 62. Next, a pattern transfer process is conducted by using a patterned mask (not shown) to remove part of the IMD layer 72, part of the liner 68, part of the IMD layer 30, and part of the stop layer 28 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer 34 and metal layer 36 to form a contact plug or metal interconnection 74 in the contact hole electrically connecting the metal interconnection 26. Similar to the aforementioned metal interconnections, the metal interconnection 74 could be formed in the IMD layer 72 according to a single damascene process or dual damascene process, in which the metal interconnection 74 further includes a via conductor 98 and a trench conductor 100 embedded in the IMD layer 72.

It should be noted that the present invention preferably injects nitrogen gas and/or carbon tetrafluoride ($CF_4$) during the formation of the aforementioned contact hole on the logic region 16 so that when part of the IMD layer 72 and part of the liner 68 are removed, more of the liner 68 is removed to form a hole recessing inward into the liner 68. After deposing conductive material including the barrier layer 34 and metal layer 36 into the contact hole to form the metal interconnection 74, protrusions 102 or protruding portions are preferably formed adjacent to two sides of the via conductor 98 of the metal interconnection 74 in the recessed portion of the liner 68. Structurally, the protrusions 102 further includes a protrusion 104 on one side of the metal interconnection 74 and a protrusion 106 on another side of the metal interconnection 74, in which the protrusions 104, 106 contact the liner 68 directly and the two protrusions 104, 106 are made of same material including barrier layer material such as Ti, TiN, Ta, TaN and/or metal layer material such as W, Cu, Al, TiAl, CoWP. Viewing from a more detailed perspective, each of the protrusions 104, 106 not only contacts the liner 68 but also contacts the IMD layers 30, 72 directly, and even though the outermost edge or sidewall of each of the protrusions 104, 106 does not surpass or extend over the sidewall of the trench conductor 100, according to another embodiment of the present invention, the outermost edge or sidewall of each of the protrusions 104, 106 could also extend horizontally to surpass the sidewall of the trench conductor 100, which is also within the scope of the present invention.

Figure 6:
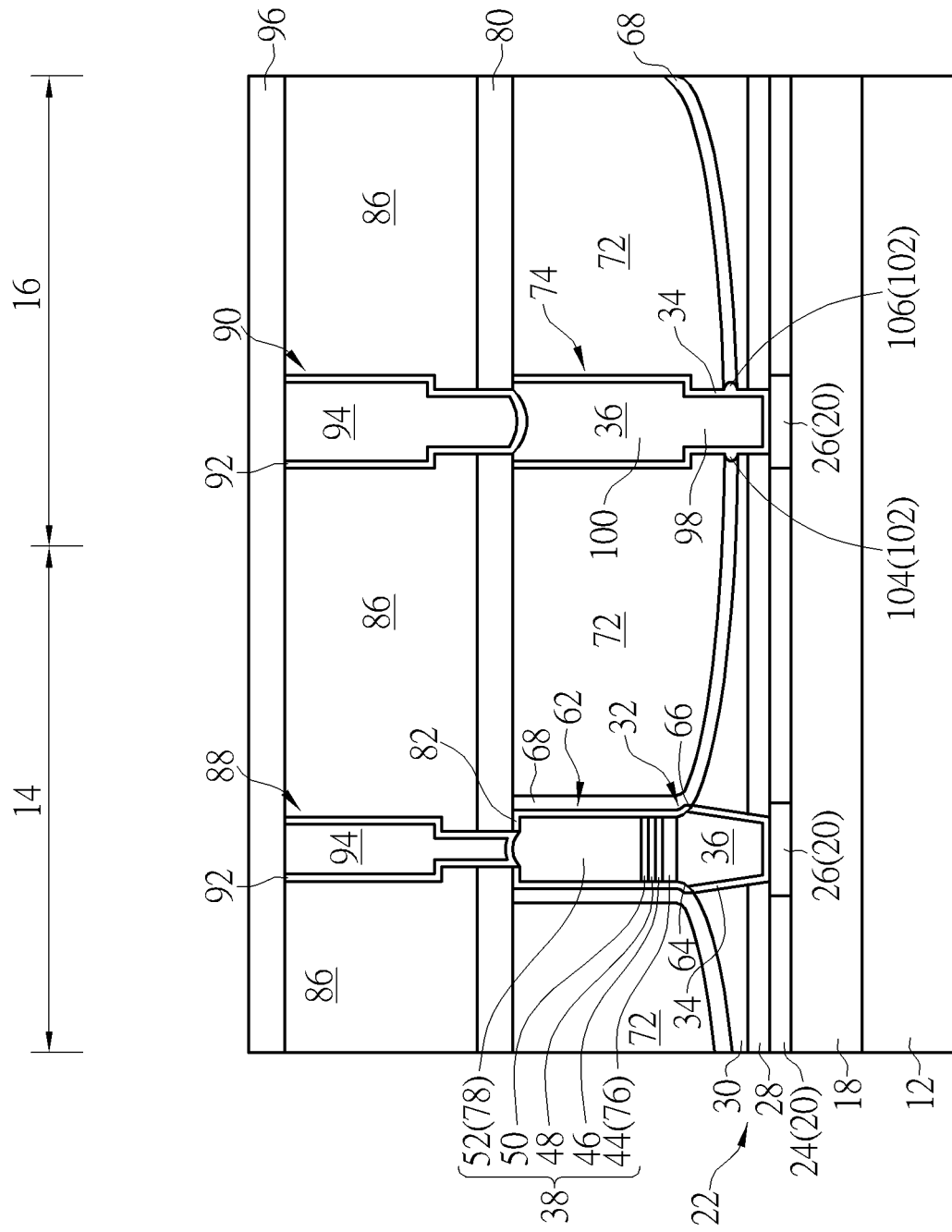

Next, as shown in FIG. 6, a stop layer 80 and another IMD layer 86 are formed on the MTJ 62 to cover the surface of the IMD layer 72, and one or more photo-etching process is conducted to remove part of the IMD layer 86, part of the stop layer 80, and part of the metal oxide layer 82 on the MTJ region 14 and part of the IMD layer 86 and part of the stop layer 80 on the logic region 16 to form contact holes (not shown). Next, conductive materials are deposited into each of the contact holes and a planarizing process such as CMP is conducted to form metal interconnections 88, 90 directly connecting the MTJ 62 and contact plug 74 on the MTJ region 14 and logic region 16, in which the metal interconnection 88 on the MTJ region 14 directly contacts the MTJ 62 underneath while the metal interconnection 90 on the logic region 16 directly contacts the contact plug 74 on the lower level. Next, another stop layer 96 is formed on the IMD layer 86 to cover the metal interconnections 88, 90.

In this embodiment, the stop layer 80 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 88, 90 could be formed in the IMD layer 86 through a single damascene or dual damascene process. For instance, each of the metal interconnections 88, 90 could further include a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

It should be noted that since the metal oxide layer 82 disposed on the topmost portion or more specifically the top electrode 78 of the MTJ 62 is made of harder material such as TaO while the metal interconnection 74 on the logic region 16 is made of softer material such as copper (Cu), it would be desirable to form metal interconnections 88, 90 on the MTJ region 14 and logic region 16 having different bottom surface profiles or more specifically opposite curves as a result of different etching selectivity underneath. For instance, since the metal oxide layer 82 on the MTJ region 14 is harder in nature therefore more resistant to etching, the bottom surface of the metal interconnection 88 formed atop the MTJ 62 by removing a portion of the metal oxide layer 82 preferably includes a curve concave downward while the corresponding top surface of the MTJ 62 directly contacting the metal interconnection 88 also includes a curve concave downward. Since the metal interconnection 74 on the logic region 16 made of Cu is softer in nature therefore more easily to be removed by etching process, the bottom surface of the metal interconnection 90 formed atop the metal interconnection 74 preferably includes a curve concave upward while the top surface of the metal interconnection 74 directly contacting the metal interconnection 90 also includes a curve concave upward. It should be noted that the metal oxide layer 82 disposed on the top surface of the MTJ 62 is preferably not removed during the aforementioned planarizing process so that part of the metal oxide layer 82 still remains on the top surface of the MTJ 62 or top electrode 78 adjacent to two sides of the curve concave downward after the metal interconnection 88 is formed.

Figure 7:
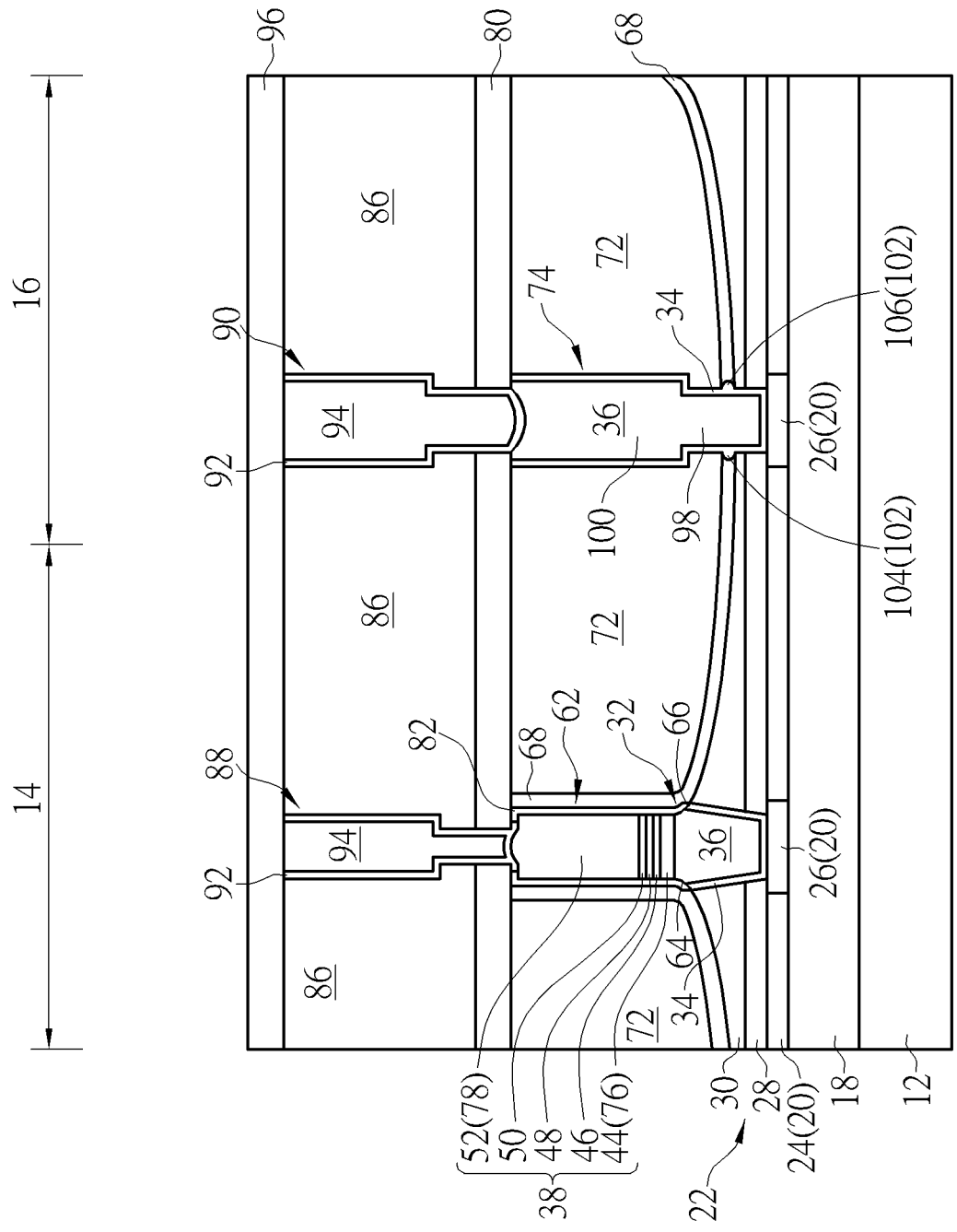
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to the aforementioned embodiment of removing only a portion of the metal oxide layer 82 directly under the metal interconnection 88, it would also be desirable to not only remove part of the metal oxide layer 82 directly under the metal interconnection 88 but also part of the metal oxide layer 82 adjacent to two sides of the via conductor of the metal interconnection 88 during the formation of the contact hole. By extending the bottom of the contact hole slightly toward horizontal direction, the bottom of the conductive material deposited into the contact hole to form the metal interconnection 88 would preferably reveal a reverse T-shape profile. Similar to the aforementioned embodiment, the bottom surface of the metal interconnection 88 and corresponding top surface of the MTJ 62 directly contacting the metal interconnection 88 in this embodiment also include a curve concave downward while the bottom surface of the metal interconnection 90 on the logic region 16 and top surface of the metal interconnection 74 directly contacting the metal interconnection 90 include a curve concave upward.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate having a magnetic tunneling junction (MTJ) region and a logic region;
a MTJ on the MTJ region;

a metal oxide layer on and directly contacting a top surface and a sidewall of the MTJ; and a first inter-metal dielectric (IMD) layer on the substrate and around the MTJ, wherein top surfaces of first IMD layer and the metal oxide layer are coplanar.

2. The semiconductor device of claim 1, further comprising:

a second IMD layer on the MTJ and the first IMD layer; and a first metal interconnection in the second IMD layer and on the MTJ.

3. The semiconductor device of claim 2, further comprising the metal oxide layer on the MTJ adjacent to two sides of the first metal interconnection.

4. The semiconductor device of claim 3, wherein the metal oxide layer is on the top surface and sidewalls of the MTJ.

5. The semiconductor device of claim 3, further comprising a liner between the metal oxide layer and the first IMD layer.

6. The semiconductor device of claim 3, wherein the metal oxide layer comprises tantalum oxide (TaO).

7. The semiconductor device of claim 2, further comprising:

a second metal interconnection in the second IMD layer on the logic region, wherein bottom surfaces of the first metal interconnection and the second metal interconnection comprise different curves.

8. The semiconductor device of claim 7, wherein bottom surfaces of the first metal interconnection and the second metal interconnection comprise opposite curves.

9. The semiconductor device of claim 7, wherein a bottom surface of the second metal interconnection comprises a curve concave upward.

10. The semiconductor device of claim 7, further comprising a third metal interconnection under the second metal interconnection in the first IMD layer, wherein a top surface of the third metal interconnection comprises a curve concave upward.

11. The semiconductor device of claim 2, wherein a bottom surface of the first metal interconnection comprises a curve concave downward.

12. The semiconductor device of claim 1, wherein a top surface of the MTJ comprises a curve concave downward.

* * * * *